US008753992B2

(12) United States Patent
Imakita (10) Patent No.: US 8,753,992 B2
(45) Date of Patent: Jun. 17, 2014

(54) GLASS CERAMIC COMPOSITION, SUBSTRATE FOR LIGHT EMITTING ELEMENT, AND LIGHT EMITTING DEVICE

(71) Applicant: Asahi Glass Company, Limited, Chiyoda-ku (JP)

(72) Inventor: Kenji Imakita, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 0 days.

(21) Appl. No.: 13/752,878

(22) Filed: Jan. 29, 2013

(65) Prior Publication Data

US 2013/0134859 A1     May 30, 2013

Related U.S. Application Data

(63) Continuation of application No. PCT/JP2011/067370, filed on Jul. 28, 2011.

(30) Foreign Application Priority Data

Jul. 29, 2010 (JP) ................................ 2010-170125

(51) Int. Cl.
C03C 14/00    (2006.01)
H01L 31/12    (2006.01)

(52) U.S. Cl.
USPC ................. 501/32; 501/66; 257/81; 257/433; 362/382

(58) Field of Classification Search
USPC ................. 501/32, 66; 257/79, 81, 432, 433; 362/382
See application file for complete search history.

(56) References Cited

U.S. PATENT DOCUMENTS

| 8,304,357 | B2 * | 11/2012 | Imakita et al. | 501/17 |
| 8,309,974 | B2 * | 11/2012 | Nakayama et al. | 257/81 |
| 2011/0001162 | A1 * | 1/2011 | Nakayama et al. | 257/99 |
| 2011/0079412 | A1 * | 4/2011 | Imakita et al. | 174/50 |
| 2011/0233601 | A1 * | 9/2011 | Nakayama | 257/99 |
| 2012/0201037 | A1 * | 8/2012 | Nakayama | 362/382 |
| 2012/0294019 | A1 * | 11/2012 | Nakayama | 362/382 |

FOREIGN PATENT DOCUMENTS

| JP | 2007-121613 | 5/2007 |
| JP | 2007-129191 | 5/2007 |
| JP | 2008-270563 | 11/2008 |
| JP | 2009-46326 | 3/2009 |
| WO | 2009/128354 | 10/2009 |

OTHER PUBLICATIONS

International Search Report issued Nov. 1, 2011 in PCT/JP2011/067370 filed Jul. 28, 2011.

* cited by examiner

*Primary Examiner* — Karl Group
(74) *Attorney, Agent, or Firm* — Oblon, Spivak, McClelland, Maier & Neustadt, L.L.P.

(57) ABSTRACT

To provide a glass ceramic composition with which a substrate for a light emitting element having a high reflectance and a high thermal conductivity can be obtained, and which can suppress breakage at the time of production of the substrate for a light emitting element. A glass ceramic composition to be used for production of a substrate on which a light emitting element is to be mounted, which comprises from 30 to 45 mass % of a glass powder, from 35 to 50 mass % of an alumina powder and from 10 to 30 mass % of a zirconia powder, to the total amount of the glass powder, the alumina powder and the zirconia powder, wherein the average particle size of the zirconia powder is at most $\frac{1}{4}$ of the average particle size of the alumina powder.

12 Claims, 1 Drawing Sheet

US 8,753,992 B2

GLASS CERAMIC COMPOSITION, SUBSTRATE FOR LIGHT EMITTING ELEMENT, AND LIGHT EMITTING DEVICE

This application is a continuation of PCT Application No. PCT/JP2011/067370, filed on Jul. 28, 2011, which is based upon and claims the benefit of priority from Japanese Patent Application No. 2010-170125 filed on Jul. 29, 2010. The contents of those applications are incorporated herein by reference in its entirety.

TECHNICAL FIELD

The present invention relates to a glass ceramic composition, a substrate for a light emitting element, and a light emitting device. Particularly, it relates to a glass ceramic composition to be used for production of a substrate on which a light emitting element is mounted, and a substrate for a light emitting element comprising the glass ceramic composition and a light emitting device.

BACKGROUND ART

In recent years, along with a tendency to high brightness and high efficiency of a light emitting diode (hereinafter sometimes referred to as LED) element, a light emitting device employing a LED element for a backlight of a mobile phone, a large sized liquid crystal TV, etc. or for general illumination, has been used. Therefore, members peripheral to the LED element are also required to have higher performance. Heretofore, as a substrate for a light emitting element on which a light emitting element such as a LED element is to be mounted, one comprising a resin material has been used. However, it is likely to be deteriorated by heat or light due to the high brightness tendency of a light emitting element, and use of one made of an inorganic material, for example, one made of a ceramic, has been studied.

A ceramic substrate may, for example, be an alumina substrate or an aluminum nitride substrate to be used for a wiring board. A ceramic substrate is promising as a substrate for a light emitting element since it has high durability to heat or light as compared with a resin substrate. However, a ceramic substrate has a low reflectance as compared with a resin substrate, and accordingly light from the light emitting element will leak to the back side of the substrate, whereby the light intensity on the surface side tends to be decreased. Further, as a ceramic substrate is usually hardly sintered, high temperature firing at higher than 1,500° C. is required, thus leading to an increase in the process cost.

In order to solve such problems, use of a low temperature co-fired ceramic (hereinafter referred to as LTCC) substrate started being studied. An LTCC substrate usually comprises a composite of glass and a ceramic filler of e.g. alumina, which can be sintered at a temperature of from about 850 to about 900° C. which is lower than that of a conventional ceramic substrate since it is sintered employing low temperature flowability of glass. Therefore, it can be co-fired with an Ag conductor to be a wiring conductor, and thus the cost can be reduced as compared with a conventional ceramic substrate. Further, a higher reflectance than that of a conventional ceramic substrate can be obtained, since light is diffusely reflected on an interface between glass and the ceramic filler. Further, as it comprises an inorganic substance, it has sufficient durability to heat and light.

As a ceramic filler to be incorporated in the LTCC substrate, typically, for example, an alumina powder has been known. Further, it has also been known to use a titania powder or a zirconia powder together with an alumina powder (for example, Patent Documents 1 and 2).

PRIOR ART DOCUMENTS

Patent Documents

Patent Document 1: WO2009/128354
Patent Document 2: JP-A-2007-129191

DISCLOSURE OF INVENTION

Technical Problem

However, an LTCC substrate is required to have a higher reflectance than ever. However, it is required not only to have a high reflectance, but also to have a high thermal conductivity in itself and have a low thermal resistance when a light emitting element is mounted, so as to suppress the decrease in brightness by the temperature increase of the light emitting element. For example, a light emitting element is mounted on a LTCC substrate by means of an adhesive, and if the surface roughness of the LTCC substrate is significant, a large amount of the adhesive is required due to the rough portion, and the thermal resistance will be increased by the adhesive. Further, a LTCC substrate is also required to be capable of being co-fired with an Ag conductor to be a wiring conductor as before.

Further, in order to efficiently produce a large number of products, a LTCC substrate is produced in such a manner that a plurality of non-fired LTCC substrates are formed on one green sheet, followed by firing to produce collected substrates having LTCC substrates collected, which are divided into separate LTCC substrates. In such a case, a notch is made between separate non-fired LTCC substrates on the green sheet, and the LTCC substrates after firing are divided into separate LTCC substrates by folding a notched portion or by cutting (so-called dicing) by diamond abrasive grains. However, at the time of division, breakage such as fracture or chipping (cracking) may occur, thus leading to a decrease in the yield and thus an increase in the cost.

Particularly in recent years, the demand for the reduction in the cost of the LTCC substrate is high, and the above-mentioned so-called multi-product production process to effectively obtain LTCC substrates from the collected substrates is predominant. If breakage occurs in such a production process, it is necessary to remove small pieces while the corresponding step is stopped, thus leading to an increase in the production cost. Further, along with an increase in the number of products to be obtained at a time, the increase in the production cost by breakage tends to be remarkable. Accordingly, in order to realize the reduction in the cost of the LTCC substrate, it is required that breakage at the time of production is less likely to occur.

The present invention has been made to solve the above problems, and its object is to provide a glass ceramic composition with which a substrate for a light emitting element (LTCC substrate) particularly having a high reflectance and a high thermal conductivity can be obtained, and which can suppress breakage at the time of production of the substrate for a light emitting element. Further, the object of the present invention is to provide a substrate for a light emitting element having a high reflectance and a high thermal conductivity, comprising such a glass ceramic composition. Further, the object of the present invention is to provide a light emitting device using such a substrate for a light emitting element.

Solution to Problem

The present inventor has conducted extensive studies to achieve the above objects and as a result, found that the reflectance, the thermal conductivity, the thermal resistance and the durability against breakage at the time of production, of a substrate for a light emitting element, very heavily depend on the content of zirconia. Further, he has found that the respective properties are in an opposite relation such that when one is improved, the other is deteriorated.

Under these circumstances, the present inventor has conducted studies and as a result, found that when the amount of zirconia in the glass ceramic composition to be used for production of a substrate for a light emitting element is from 10 to 30 mass % and the average particle size of zirconia particles is at most ¼ of the average particle size of alumina particles, industrially sufficient reflectance, thermal conductivity and thermal resistance can be obtained, and in addition, breakage at the time of production can be suppressed. The present invention has been accomplished based on such a discovery.

That is, the glass ceramic composition of the present invention comprises a glass powder, an alumina powder and a zirconia powder having an average particle size of at most ¼ of the average particle size of the alumina powder, in a proportion of the glass powder of from 30 to 45 mass %, a proportion of the alumina powder of from 35 to 50 mass % and a proportion of the zirconia powder of from 10 to 30 mass %, to the total amount of the glass powder, the alumina powder and the zirconia powder.

Further, the method for producing a substrate for a light emitting element of the present invention comprises firing a formed product of the above glass ceramic composition at a temperature at which glass of the glass powder is softened.

Further, the substrate for a light emitting element of the present invention is a substrate on which a light emitting element is to be mounted, which is formed by firing a formed product of the above glass ceramic composition of the present invention. Further, the light emitting device of the present invention is a light emitting device comprising a substrate for a light emitting element and a light emitting element mounted on the substrate for a light emitting element, wherein the substrate for a light emitting element is the above substrate for a light emitting element of the present invention.

Advantageous Effects of Invention

According to the glass ceramic composition of the present invention, which contains a glass powder, an alumina powder and a zirconia powder in predetermined proportions, the zirconia powder having an average particle size of ¼ of the average particle size of the alumina powder, a substrate for a light emitting element having a high reflectance and a high thermal conductivity can be obtained. Further, according to the glass ceramic composition of the present invention, breakage at the time of production of a substrate for a light emitting element can be suppressed, whereby mass production of substrates for a light emitting element can be carried out stably at a low cost.

The substrate for a light emitting element of the present invention, which is obtained by forming and firing the above glass ceramic composition, can have a high reflectance and a high thermal conductivity. Further, the light emitting device of the present invention, which employs the above substrate for a light emitting element, can have excellent light emitting efficiency and the like.

DESCRIPTION OF EMBODIMENTS

Figure 1:
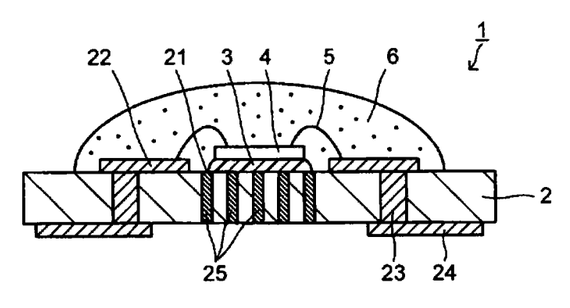
The FIGURE is a cross-sectional view illustrating one example of a light emitting device of the present invention.

Now, the embodiments of the present invention will be described.

The glass ceramic composition according to the embodiment is a glass ceramic composition to be used for production of a substrate for a light emitting element (LTCC substrate, hereinafter referred to simply as a substrate) on which a light emitting element such as a light emitting diode element (LED element) is to be mounted. The glass ceramic composition of the present invention comprises a glass powder, an alumina powder and a zirconia powder, and not only means a mixture of such inorganic powders alone but also means a composition containing such inorganic powders and an organic component such as a binder or a solvent (for example, a composition in the form of a slurry or a green sheet as mentioned hereinafter). The inorganic powders contained in the glass ceramic composition of the present invention are not limited to the above three types of inorganic powders, and another inorganic powder may be contained.

With respect to the proportions of the three types of the inorganic powders contained in the composition of the present invention, the proportion of the glass powder is from 30 to 45 mass %, the proportion of the alumina powder is from 35 to 50 mass %, and the proportion of the zirconia powder is from 10 to 30 mass %, to the total amount of the above three types of the inorganic powders. Further, in the composition of the present invention, the average particle size of the zirconia powder is at most ¼ of the average particle size of the alumina powder.

According to such a glass ceramic composition, which particularly contains from 10 to 30 mass % of a zirconia powder having an average particle size of at most ¼ of the average particle size of the alumina powder, a substrate having both high reflectance and high thermal conductivity, for example, a substrate having a reflectance of at least 90% and a thermal conductivity of at least 2.5 W/m·K can be obtained. Further, breakage such as fracture or chipping can be suppressed at the time of production of the substrate, particularly in a case where collected substrates having a plurality of substrates collected are divided into separate substrates.

Further, by mainly using the zirconia powder as a refractive index filler which contributes to an improvement in the reflectance, a decrease in the reflectance by absorption of light at 400 nm or less, as in the case of mainly using a titania powder, can be suppressed. Accordingly, the glass ceramic composition is suitably applicable to a so-called ultraviolet LED element which emits light having a wavelength of at most 400 nm.

The zirconia powder (zirconia filler) in the glass ceramic composition is a component to improve the reflectance of the substrate. Heretofore, an alumina powder (refractive index: 1.8) has been used as a ceramic powder (ceramic filler) for this type of substrate, however, by using a zirconia powder (refractive index: 2.2) having a refractive index higher than the alumina powder, the light diffusion at an interface between glass and the ceramic powder is increased, whereby a reflectance higher than a conventional ceramic substrate can be obtained. In order to obtain a practically sufficient reflectance, the content of the zirconia powder is at least 10 mass %. If the content of the zirconia powder is less than 10 mass %, it tends to be difficult to obtain a high reflectance, for example, a reflectance of at least 90%. Here, the reflectance in the present invention is at a wavelength of 460 nm.

On the other hand, the thermal conductivity of the zirconia powder is so low as about 3 W/m·K, relative to the thermal conductivity of the alumina powder of about 30 W/m·K. Accordingly, if the amount of the zirconia powder is increased, the thermal conductivity of the substrate tends to be low. If its content exceeds 30 mass %, a substrate having a high thermal conductivity, for example, a thermal conductivity of at least 2.5 W/m·K will hardly be obtained.

Further, the zirconia powder is also a component which lowers the sintering properties. If its content exceeds 30 mass %, due to the decrease in the sintering properties, the zirconia powder is likely to expose on the surface of the substrate, and for example, the surface roughness of the substrate tends to be so large as more than 0.35 μm. If an LED element is mounted on a substrate having a surface roughness more than 0.35 μm, the thermal resistance tends to be high by an adhesive use for bonding, such being unfavorable. In order to obtain a substrate having a surface roughness of at most 0.35 μm and having a low thermal resistance, the content of the zirconia powder is preferably at most 30 mass %. Further, if the content of the zirconia powder exceeds 30 mass %, due to the decrease in the sintering properties, the substrate may not sufficiently be densified but will be porous. In such a substrate, in a plating step, a plating liquid may infiltrate, and when such a substrate is used for a light emitting device, the plating liquid may ooze, thus lower the reliability.

Further, the present inventor has found that by employing the zirconia powder in the form of fine particles, breakage such as fracture or chipping can be suppressed at the time of production of the substrate, particularly in a case where collected substrates having a plurality of substrates collected are divided into separate substrates. That is, he has found that in a case where a plurality of non-fired substrates are formed on one green sheet, and a notch is formed between the non-fired substrates, followed by firing, and the fired substrates are divided into separate substrates by cutting along the notch, by adding a zirconia powder in the form of fine particles to the glass ceramic composition to be the green sheet, breakage such as fracture or chipping can be suppressed.

Such breakage occurs due to progress of cracking along the continuous vitreous phase in the substrate in a direction different from the aimed direction. By adding the zirconia powder in the form of fine particles to the vitreous phase, progress of cracking in a direction different from the aimed direction can be suppressed. The factors for such an effect may be a very high fracture toughness of the zirconia powder, a very small particle size of the zirconia powder, very little elution of the zirconia powder into the vitreous phase, and the like.

In the following, the easiness of division at the time of dividing (or difficulty of breakage at the time of dividing) will be referred to as "divisibility". A substrate with good divisibility means a substrate with a high non-defective ratio, which is less likely to undergo breakage such as fracture or chipping in the above step.

In order to obtain the above effect, it is preferred that the zirconia powder is well dispersed in the substrate after sintering, with less aggregation or the like. Further, it is preferred that the average particle size of the zirconia powder (particles) in the substrate is sufficiently smaller than the average particle size of the alumina powder (particles). In the present invention, the average particle size of the zirconia powder is at most ¼ of the average particle size of the alumina powder. For example, assuming that the alumina particles are spheres (1) having a radius r, the close-packed structure is achieved when the spheres (1) are disposed in a regular tetrahedral structure.

On that occasion, the length of the side of the regular tetrahedron is equal to the center distance of the spheres with a radius r, which is 2r. Assuming that spheres (2) which fit into the space between the spheres packed in a regular tetrahedral structure are zirconia particles, the maximum radius geometrically calculated is a length obtained by subtracting the radius of the spheres (1) from the distance between the center of gravity of the regular tetrahedron with a side of 2r to the vertex, which is $(\sqrt{6}-2)\cdot r/2$. This value can be approximated to be $0.225\cdot r$, however, practically, it is considered that the spheres (1) are in a structure with a lower density than the close-packed structure, and accordingly, the maximum radius of the spheres (2) is considered to be $(¼)\cdot r$, which constitutes evidence of the average particle size of the zirconia powder. As mentioned above, when the average particle size of the zirconia powder is smaller than ¼ of the average particle size of alumina, the space between the alumina particles is filled with the zirconia particles and as a result, the continuous glass phase becomes discontinuous by the presence of the zirconia powder, thus leading to an improvement in the divisibility.

To improve the divisibility, filling with a zirconia powder is effective. As evident from the fact that zirconia is used for fire bricks for glass fusion, it has a high melting point and is less likely to react with the fused glass. By such properties, it is considered to hardly react with the fused glass at the time of firing LTCC. Accordingly, it is considered that when the LTCC is filled with the zirconia powder, the glass phase tends to be discontinuous, whereby the divisibility will improve. It is considered that in the case of the alumina powder, it is likely to react with the fused glass at the time of firing LTCC, to be dissolved in the glass phase and unified with the glass phase, whereby the glass phase is less likely to be discontinuous, and even when the space is filled with the zirconia powder, the divisibility is less likely to improve.

The average particle size of the zirconia powder is preferably at most ⅙, more preferably at most ⅛ of the average particle size of the alumina powder. Usually, the average particle size of the zirconia powder is preferably at least ¹⁄₅₀, more preferably at least ¹⁄₃₀ of the average particle size of the alumina powder.

For example, in a case where an alumina powder having an average particle size at a level of 2 μm is used, the average particle size of the zirconia powder is preferably at most 0.5 μm. If it is larger than 0.5 μm, no sufficient improvement in the divisibility may be obtained. It is more preferably at most 0.30 μm, further preferably at most 0.25 μm. Further, in a case where the zirconia powder is aggregated in the substrate, the particle size of the aggregated powder is preferably at most 0.5 μm, more preferably at most 0.30 μm, further preferably at most 0.25 μm.

On the other hand, from the viewpoint of improvement in the reflectance, the average particle size of the zirconia powder is preferably from 0.03 to 1.0 μm. If the average particle size of the zirconia powder exceeds 1.0 μm, it tends to be difficult to obtain a high reflectance since the zirconia powder is too large relative to the wavelength (460 nm in the present invention) of light. Further, if the average particle size of the zirconia powder is less than 0.03 μm, it tends to be difficult to obtain a high reflectance since the zirconia powder is too small relative to the wavelength of light. Further, if the average particle size of the zirconia powder is less than 0.03 μm, the sintering properties of the substrate will be deteriorated, the surface roughness tends to be significant, and the thermal resistance when a LED element is mounted tends to be deteriorated. With a view to improving the reflectance and suppressing the insufficient sintering, the average particle size of the zirconia powder is more preferably at least 0.05 μm, more preferably at least 0.08 μm.

In view of the above effects, the average particle size of the zirconia powder in the glass ceramic composition is preferably from 0.03 to 0.5 μm, more preferably from 0.03 to 0.40 μm, more preferably from 0.03 to 0.30 μm, still further preferably from 0.03 to 0.25 μm. Further, the lower limit may be the above-mentioned preferred value.

Here, the average particle size of the zirconia powder is evaluated by the following method. First, the zirconia powder is embedded in a resin (product number 20-3400-080 manufactured by BUEHLER) by using a resin embedding machine (SIMPLIMET 2 manufactured by BUEHLER). One surface of the resin is polished by using Ecomet 3000 manufactured by BUEHLER with a water resistance abrasive paper of roughness number 620, then polished with a water resistant abrasive paper of roughness number 320 and then polished by using a polishing plate (TEXMET P) manufactured by BUEHLER with an abrasive slurry containing diamond with a particle size of 6 μm, and further polished by using a polishing plate (TEXMET 1000) manufactured by BUEHLER with an abrasive slurry containing diamond with a particle size of 3 μm, and finally buffed by using a polishing plate (MASTER TEX) manufactured by BUEHLER with a polishing suspension (MASTERPREP) manufactured by BUEHLER. The obtained polished surface is observed by FE-SEM (model JXA-8500F) manufactured by JEOL Ltd. with a magnification of at least 10,000 times, and a SEM photograph of the zirconia powder in the resin is taken. Using the obtained SEM photograph, at least 100 particles of the zirconia powder are randomly selected and their diameters are measured by a ruler or the like to prepare a particle size distribution map, and the obtained average particle size is regarded as the average particle size of the zirconia powder.

The reflectance, the thermal conductivity and the surface roughness of the substrate, and the divisibility, may be adjusted by adjusting the content of the zirconia powder, in addition to adjusting the average particle size of the zirconia powder as mentioned above. The content of the zirconia powder is more preferably from 15 to 30 mass % to the total amount of the glass powder, the alumina powder and the zirconia powder. In addition, the content is preferably further adjusted depending upon which property among the above properties is to be mainly adjusted.

For example, when emphasis is put particularly on the reflectance among the reflectance, the thermal conductivity, the surface roughness and the divisibility, the content of the zirconia powder is preferably from 20 to 30 mass %, more preferably from 23 to 29 mass %, further preferably from 25 to 28 mass %. When the content of the zirconia powder is relatively high, the reflectance can be improved efficiently.

Further, in a case where emphasis is put on the thermal conductivity or the thermal resistance, the content of the zirconia powder is preferably from 10 to 20 mass %, more preferably from 15 to 19 mass %, further preferably from 16 to 18 mass %. When the content of the zirconia powder having a low thermal conductivity is relatively reduced, the thermal conductivity can be improved. Further, when the content of the zirconia powder is relatively reduced, the sintering properties of the glass ceramic composition will be improved, the surface roughness tends to be small, and the thermal resistance when a LED element is mounted can be reduced.

Further, in a case where emphasis is put on the balance of the reflectance, the thermal conductivity, the surface roughness and the divisibility, the content of the zirconia powder is preferably from 17 to 28 mass %, more preferably from 20 to 27 mass %, further preferably from 24 to 26 mass %. When the content of the zirconia powder is at least 17 mass %, a relatively high reflectance can be realized. Further, when the content of the zirconia powder is at most 28 mass %, a relatively high thermal conductivity can be realized.

The zirconia powder may be non-stabilized zirconia but is usually preferably partially stabilized zirconia having at least part thereof stabilized by addition of $Y_2O_3$, CaO or MgO or stabilized zirconia. By employing partially stabilized zirconia or stabilized zirconia, the phase transition at high temperature for example is suppressed, whereby a substrate having stable properties can be obtained. The type of the partially stabilized zirconia is not necessarily limited, but $Y_2O_3$-added zirconia which is industrially easily available at a low cost is preferred. Further, the addition amount of $Y_2O_3$ is preferably from 0.1 to 10 mol %.

In the present invention, as the ceramic powder to improve the reflectance, a zirconia powder having a high refractive index is used, however, a high refractive index ceramic powder other than the zirconia powder may also be contained for the purpose of improving the reflectance. However, if titania or a titanium compound such as barium titanate, strontium titanate or potassium titanate is used as a high refractive index filler, the substrate may be colored due to elution of titanium ions into the glass and as a result, the reflectance may be decreased. From such a reason, the content of titania or a titanium compound is preferably at most 3 mass %, more preferably at most 1 mass %, and further preferably, it is substantially not contained. The mass ratio thereof is the mass ratio of the powder of titania or the like to the total amount of the glass powder, the alumina powder, the zirconia powder and the powder of titania or the like.

In the same manner as the case of the powder of titania or the like, the glass ceramic composition of the present invention may contain at least one type of inorganic powder other than the three types of the glass powder, the alumina powder and the zirconia powder. However, the total amount of the inorganic powder other than the three types is preferably less than 10 mass %, more preferably less than 5 mass % to the total amount of the inorganic powders. Particularly, an inorganic powder (other than the above three types) remaining as an inorganic component after firing is preferably substantially not contained.

The alumina powder in the glass ceramic composition is to be added to improve the flexural strength of the substrate, and is contained in an amount of from 35 to 50 mass % (the proportion to the total amount of the glass powder, the alumina powder and the zirconia powder) in the glass ceramic composition. If the content of the alumina powder is less than 35 mass %, a substrate having a high flexural strength will not be obtained. With a view to obtaining a substrate having a higher flexural strength, the content of the alumina powder is preferably at least 36 mass %.

On the other hand, if the content of the alumina powder exceeds 50 mass %, no dense substrate will be obtained, and a substrate having a decreased surface smoothness tends to be obtained. With a view to obtaining a substrate being more dense and having a smooth surface, the content of the alumina powder is preferably at most 48 mass %.

The average particle size of the alumina powder is preferably from 0.3 to 5 μm. When the average particle size is at least 0.3 μm, a substrate having a high flexural strength is likely to be obtained. With a view to obtaining a substrate having a higher flexural strength, the average particle size is more preferably at least 0.6 μm, further preferably at least 1.5 μm. On the other hand, when the average particle size is at most 5 μm, a substrate being dense and having a smooth surface is likely to be obtained. With a view to obtaining a substrate being more dense and having a more smooth surface, the average particle size is more preferably at most 4 μm, further preferably at most 3 μm. The average particle size of the alumina powder can be evaluated by the same method as for the average particle size of the zirconia powder. That is, it can be evaluated by observing the alumina powder embedded in a resin by means of SEM.

The content of the glass powder in the glass ceramic composition is from 30 to 45 mass % (the proportion to the total amount of the glass powder, the alumina powder and the zirconia powder). If the content of the glass powder is less than 30 mass %, a dense substrate will hardly be obtained. With a view to obtaining a more dense substrate, the content of the glass powder is preferably at least 31 mass %, more preferably at least 32 mass %.

On the other hand, if the content of the glass powder exceeds 45 mass %, a substrate having a high flexural strength will hardly be obtained. With a view to obtaining a substrate having higher flexural strength, the content of the glass powder is preferably at most 43 mass %, more preferably at most 39.5 mass %.

The average particle size of the glass powder is preferably from 0.5 to 5 μm. When the average particle size is at least 0.5 μm, such a glass powder is industrially easily produced, it is hardly aggregated and is thereby easily handled, and is easily dispersed in the glass ceramic composition. The average particle size is more preferably at least 0.8 μm, further preferably at least 1.5 μm. On the other hand, if the average particle size is at most 5 μm, a dense substrate is easily obtained by firing. The average particle size of the glass powder can be evaluated by the same method for the average particle size of the zirconia powder and the alumina powder. That is, it can be evaluated by observing the glass powder embedded in a resin by means of SEM.

The glass in the glass powder is preferably glass having a glass softening point (Ts) of from 650 to 950° C., which is less likely to be crystallized when molten glass is cooled. If the glass softening point (Ts) is to high, even when the temperature at which the glass materials are fused for production of the glass exceeds 1,600° C., the viscosity of the molten glass is high, and the glass materials will not homogeneously be mixed, whereby it tends to be difficult to produce homogeneous glass at a low cost, and the sintering properties of glass are also decreased, whereby no dense substrate may be obtained. On the other hand, if the glass softening point (Ts) is too low, problems such as foaming of the substrate may arise. Further, in a case where a formed product using an Ag type conductor (Ag conductor, Au-containing Ag conductor or Pd-containing Ag conductor) as a conductor material for a wiring conductor is fired, the glass is likely to react with the conductor material due to the low viscosity of the glass, whereby the substrate may be colored, the resistivity of the conductor may be increased, breaking of wire may occur, or other problems may occur. More preferred glass is glass having a glass softening point (Ts) of from 750 to 850° C.

Further, in a case of glass which is likely to be crystallized, in the sintering step, when the temperature is dispersed for example by the dispersion of the temperature in the firing furnace, moieties differing in the degree of crystallization are likely to form and as a result, problems such as warpage or deformation of the substrate tend to arise. Further, usually, glass in the interior or glass which is in contact with the Ag type conductor formed on the surface is likely to be crystallized, whereby moieties differing in the degree of crystallization are likely to form and as a result, problems such as warpage or deformation of the substrate tends to arise.

The glass powder is not necessarily limited and for example, a borosilicate glass powder is suitably used. The borosilicate glass may be particularly suitably borosilicate glass comprising, as calculated as oxides, from 57 to 65 mol % of $SiO_2$, from 13 to 18 mol % of $B_2O_3$, from 9 to 23 mol % of CaO, from 3 to 8 mol % of $Al_2O_3$ and from 0.5 to 6.0 mol % of $K_2O$ and $Na_2O$ in total. With such borosilicate glass, crystallization of the glass phase at the time of firing will be suppressed, whereby a substrate with small warpage will be obtained.

$SiO_2$ is a glass network former and is a component to suppress crystallization of the glass to improve the stability, and to improve the chemical durability such as the acid resistance as well. The $SiO_2$ content in the borosilicate glass is preferably at least 57 mol %. If it is less than 57 mol %, crystals tend to deposit at the time of firing, whereby the substrate is likely to be warped, and the chemical durability may be insufficient. With a view to obtaining more excellent stability and chemical durability, the $SiO_2$ content is more preferably at least 58 mol %, further preferably at least 59 mol %, particularly preferably at least 60 mol %.

On the other hand, the $SiO_2$ content in the borosilicate glass is preferably at most 65 mol %. If it exceeds 65 mol %, the glass transition point (Tg) or the glass softening point (Ts) may be excessively high, whereby it tends to be difficult to produce homogeneous glass at a low cost, and further, the sintering properties of the glass tend to be lowered, whereby no dense substrate may be obtained. With a view to obtaining more excellent productivity and sintering properties, the $SiO_2$ content is more preferably at most 64 mol %, further preferably at most 63 mol %.

$B_2O_3$ is a glass network former and is a component to improve the sintering properties of glass. The $B_2O_3$ content in the borosilicate glass is preferably at least 13 mol %. If it is less than 13 mol %, the glass transition point (Tg) or the glass softening point (Ts) may be excessively high, whereby it tends to be difficult to produce homogeneous glass at a low cost, and further, the sintering properties of the glass tend to be lowered, whereby no dense substrate may be obtained. With a view to obtaining more excellent productivity and sintering properties, the $B_2O_3$ content is more preferably at least 14 mol %, further preferably at least 15 mol %.

On the other hand, the $B_2O_3$ content in the borosilicate glass is preferably at most 18 mol %. If it exceeds 18 mol %, the glass is likely to undergo phase separation, whereby stable mass production of substrates may not be conducted, and further, the chemical durability such as the acid resistance may be insufficient. With a view to conducting mass production more stably and obtaining more excellent chemical durability, the $B_2O_3$ content is more preferably at most 17 mol %, further preferably at most 16 mol %.

$Al_2O_3$ is a component to suppress phase separation of the glass to improve the stability, and to improve the chemical durability and the strength as well. The $Al_2O_3$ content in the borosilicate glass is preferably at least 3 mol %. If the $Al_2O_3$ content is less than 3 mol %, the glass is likely to undergo phase separation, whereby stable mass production of substrates may not be conducted. With a view to further suppressing phase separation, the $Al_2O_3$ content is more preferably at least 4 mol %, further preferably at least 5 mol %.

On the other hand, the $Al_2O_3$ content in the borosilicate glass is preferably at most 8 mass %. If the $Al_2O_3$ content exceeds 8 mol %, the glass transition point (Tg) or the glass softening point (Ts) may be excessively high, and further, crystals represented by anorthite ($SiO_2$—$Al_2O_3$—CaO) are likely to deposit at the time of firing, whereby the substrate tends to be warped. With a view to obtaining more excellent productivity and sintering properties and suppressing deposition of crystals, the $Al_2O_3$ content is preferably at most 7 mol %, more preferably at most 6.5 mol %.

CaO is a component to stabilize the glass and to lower the glass transition point (Tg) or the glass softening point (Ts) thereby to improve the sintering properties. The CaO content in the borosilicate glass is preferably at least 9 mol %. If the CaO content is less than 9 mol %, the stability of the glass tends to be lowered, and the glass transition point (Tg) or the glass softening point (Ts) may be excessively high. With a view to obtaining more stable glass, the CaO content is preferably at least 10 mol %, and particularly when the glass transition point (Tg) or the glass softening point (Ts) is to be lowered, it is preferably at least 12 mol %, more preferably at least 13 mol %, further preferably at least 14 mol %.

On the other hand, the CaO content is preferably at most 23 mol %. If the CaO content exceeds 23 mol %, the stability of the glass may be lowered, and further, crystals represented by anorthite are likely to deposit at the time of firing, whereby the substrate tends to be warped, and further, the chemical durability such as the acid resistance may be insufficient. With a view to obtaining more excellent stability and chemical durability, the CaO content is more preferably at most 22 mol %, further preferably at most 21 mol %, typically preferably at most 20 mol %, particularly preferably at most 18 mol %.

$K_2O$ and $Na_2O$ are components to lower the glass transition point (Tg) or the glass softening point (Ts) and to improve the sintering properties, and at least one of them is preferably contained. The total content of $K_2O$ and $Na_2O$ in the borosilicate glass is preferably at least 0.5 mol %. If it is less than 0.5 mol %, the glass transition point (Tg) or the glass softening point (Ts) may be excessively high. The total content of $K_2O$ and $Na_2O$ is more preferably at least 0.8 mol %.

On the other hand, the total content of $K_2O$ and $Na_2O$ in the borosilicate glass is preferably at most 6 mol %. If it exceeds 6 mol %, the chemical durability particularly the acid resistance may be lowered, and the electrical insulating properties of the substrate may also be lowered. The total content of $K_2O$ and $Na_2O$ is more preferably at most 5 mol %, further preferably at most 4 mol %.

The borosilicate glass usually preferably comprises only the above components, but may contain other components as the case requires. For example, the borosilicate glass may contain at least one member selected from SrO and BaO in addition to CaO. SrO and BaO are components to lower the glass transition point (Tg) or the glass softening point (Ts) and to improve the sintering properties as well, like CaO. However, SrO and BaO are more likely to lower the chemical durability than CaO. Accordingly, each of the contents of SrO and BaO is preferably at most 3 mol %, more preferably at most 1 mol % in the borosilicate glass. The total content of CaO, SrO and BaO is preferably from 9 to 23 mol % in the borosilicate glass.

Further, the borosilicate glass may contain MgO or ZnO in addition to CaO, SrO and BaO. MgO and ZnO are components to improve the sintering properties like CaO or the like. However, MgO and ZnO are more likely to accelerate crystallization than CaO or the like. Accordingly, each of the contents MgO and ZnO is preferably at most 3 mol %, more preferably at most 1 mol % in the borosilicate glass. The total content of CaO, SrO, BaO, MgO and ZnO is preferably from 9 to 23 mol % in the borosilicate glass.

Further, the borosilicate glass may contain $Li_2O$ in addition to $K_2O$ or $Na_2O$. $Li_2O$ is a component to improve the sintering properties like $Na_2O$ and $K_2O$, but is also a component to lower the chemical durability of the glass. Accordingly, the $Li_2O$ content in the borosilicate glass is preferably at most 3 mol %, more preferably at most 1 mol %. The total content of $K_2O$, $Na_2O$ and $Li_2O$ in the borosilicate glass is preferably from 0.5 to 6 mol %.

Further, the borosilicate glass may contain $TiO_2$ for the purpose of lowering the viscosity of the glass melt, and in such a case, the $TiO_2$ content is preferably at most 3 mol %. Further, for the purpose of improving the stability of the glass, $ZrO_2$, $La_2O_3$, $Gd_2O_3$ or the like may be contained, and each of the respective contents is preferably at most 3 mol %. The total content of $TiO_2$, $ZrO_2$ and the like in the borosilicate glass is preferably at most 10 mol %.

Further, the borosilicate glass may contain, for example, $Fe_2O_3$. However, as $Fe_2O_3$ absorbs light at 460 nm, if its content is excessively high, the reflectance at this wavelength tends to be lowered. Accordingly, the $Fe_2O_3$ content in the borosilicate glass is preferably at most 0.05 mol %, more preferably at most 0.03 mol %, further preferably at most 0.01 mol %, and substantially no $Fe_2O_3$ is preferably contained. Further, the borosilicate glass preferably contains no lead oxide in view of influences over the environment.

The glass powder may be usually produced by producing glass, for example, the borosilicate glass having the above composition by a melting method, and grinding the glass. The grinding method is not particularly limited, and may be either wet grinding or dry grinding. In the case of wet grinding, it is preferred to use water as a solvent. Further, for grinding, a grinding machine such as a roll mill, a ball mill or a jet mill may suitably be used. The glass after grinding may be dried and classified as the case requires.

The glass ceramic composition of the present invention is a composition comprising the glass powder, the alumina powder and the zirconia powder and containing an organic component such as a binder or a processing aid. The organic component is a component which can be lost at the time of firing or which can be lost by the time of firing, and is not contained in the fired product.

The binder is used to bind the particles of the inorganic powder thereby to maintain a predetermined shape of the inorganic powder. The binder is preferably a resin such as a synthetic resin or a natural resin, which will be quickly decomposed and lost at the temperature at the time of firing. The processing aid is preferably a low boiling point solvent or a high boiling point solvent in which the binder will be dissolved. In addition, the processing aid such as a dispersing agent may be used.

In order to form the inorganic powder into a predetermined shape (for example, a sheet form), a liquid composition (hereinafter referred to as a slurry) containing a binder and a solvent is used. The slurry is formed into a sheet for example, and the low boiling point solvent in the slurry is removed by evaporation, whereby a sheet-form solid composition (hereinafter referred to as a green sheet) is obtained. The form is not limited to a sheet, and formed products with various shapes can be obtained from the slurry or a composition with a small amount of the solvent. The green sheet or the formed product preferably contains the binder, and a high boiling point solvent (hereinafter referred to as a plasticizer) in which the binder is dissolved as well.

In a case where the glass ceramic composition of the present invention is a formed product before firing such as a green sheet, the proportion of the organic component contained in the glass ceramic composition is preferably from 3 to 35 mass %, more preferably from 5 to 30 mass % to the composition. In this proportion, the proportion of the resin as the binder is preferably from 3 to 30 mass %, more preferably from 5 to 25 mass % to the composition.

Further, the proportion of the organic component in the glass ceramic composition (slurry or the like) of the present invention containing a low boiling point solvent is preferably from 7 to 50 mass %, more preferably from 10 to 40 mass % to the composition. In this proportion, the proportion of the low boiling point solvent is preferably from 5 to 30 mass %, more preferably from 10 to 25 mass % to the composition.

The glass ceramic composition containing the above organic component may be prepared by blending and mixing the glass powder, the alumina powder and the zirconia powder, and the organic component selected as the case requires in a predetermined proportion. Such a glass ceramic composition is usually used for production of a formed product such as a green sheet, in a case where the composition is a slurry, and is used for production of a substrate by firing in a case where the composition is a formed product such as a green sheet.

Specifically, for example, with the organic powders, a thermally decomposable resin such as polyvinyl butyral or an acrylic resin, and as the case requires, a plasticizer (high boiling point solvent) such as dibutyl phthalate, dioctyl phthalate or butylbenzyl phthalate, and the like, are blended and mixed. Then, to this mixture, a low boiling point solvent such as toluene, xylene or butanol is added to prepare a slurry, and this slurry is applied e.g. by a doctor blade method on a film of e.g. polyethylene terephthalate and is formed into a sheet. Further, the sheet-form product is dried to remove the solvent thereby to prepare a green sheet.

Particularly when aggregation of the glass powder or the ceramic powder is remarkable, in order to suppress aggregation, the green sheet is prepared preferably as follows. That is, first, the inorganic powders are added to a low boiling point solvent such as toluene, xylene or butanol, and as the case requires, a plasticizer such as dibutyl phthalate, dioctyl phthalate or butylbenzyl phthalate is added. The obtained slurry together with zirconia balls having a diameter at a level of 2 mm is put in a ball mill and rotated at a rate of about 90 rpm for at least 2 hours to sufficiently loosen the aggregates of the powder. Then, with this slurry, a thermally decomposable resin such as polyvinyl butyral or an acrylic resin is blended and mixed, followed by forming, thereby to prepare a green sheet with a small influence of aggregation.

On the formed product such as a green sheet, as the case requires, a wiring pattern or a via as a through hole conductor, etc. are formed by e.g. screen printing using an Ag paste or the like. Further, it is possible to form overcoat glass to protect e.g. the wiring conductor formed by firing the wiring pattern, e.g. by screen printing.

The formed product such as a green sheet is fired and then processed into a desired shape to obtain a substrate. Here, the substrate may be one having one green sheet fired or may be one having a laminate of a plurality of green sheets fired. Firing is carried out by heating at a temperature of at least the glass softening point (Ts) of the glass of the glass powder to soften the glass powder. The firing is carried out by holding the green sheet(s) usually at from 850 to 900° C. for from 20 to 60 minutes. The firing temperature is more preferably from 860 to 880° C. In a case where a wiring pattern is formed e.g. by an Ag paste on the green sheet, as the melting point of Ag is at a level of 960° C., by firing at 900° C. or lower, softening of Ag at the time of firing can sufficiently be suppressed, and the shape of the wiring pattern, the via or the like can be maintained.

The average particle size of the alumina powder (particles) dispersed in such a substrate is preferably from 0.3 to 5 µm, more preferably from 0.6 to 4 µm, further preferably from 1.5 to 4 µm. Further, the average particle size of the zirconia powder (particles) is preferably at most 1/4, more preferably at most 1/6, further preferably at most 1/8 of the average particle size of the alumina powder (particles). Usually, the average particle size of the zirconia powder (particles) is preferably at least 1/50, more preferably at least 1/30 of the average particle size of the alumina powder (particles).

The particle size and the average particle size of the alumina powder (particles) and the zirconia powder (particles) dispersed in the substrate can be obtained by cutting the substrate and observing and evaluating the cross-section e.g. by SEM. Further, the alumina powder (particles) and the zirconia powder (particles) having such average particle sizes can easily be obtained by using the above glass ceramic composition.

Further, of the substrate, the reflectance is preferably at least 90%, more preferably at least 91%, further preferably at least 92%. Further, the thermal conductivity is preferably at least 2.5 W/m·K, more preferably at least 3.0 W/m·K, further preferably at least 3.5 W/m·K. Further, the surface roughness is preferably at most 0.35 µm, more preferably at most 0.34 µm, further preferably at most 0.32 µm.

Further, of the substrate, the degree of crystallinity of the glass phase is preferably at most 60%, more preferably at most 35%, further preferably at most 15% by volume ratio, with a view to suppressing warpage at the time of firing (production). Here, the degree of crystallinity means the proportion (volume ratio) of the crystalline region in the glass phase.

The degree of crystallinity can be determined by evaluating the proportion of the diffraction peak intensity of the alumina particles (or the zirconia particles) obtained by measuring the X-ray diffraction of the prepared substrate, and the diffraction peak intensity of crystals deposited from the glass phase. Otherwise, the degree of crystallinity can be determined also by evaluating the area ratio of crystals deposited and the amorphous region, obtained by observing the cross-section of the prepared LED element substrate by an electron microscope.

Such a degree of crystallinity can be achieved, for example, by using a powder of the above borosilicate glass as the glass powder. Further, even when crystals deposit in the glass phase, measurement of the particle size of the alumina powder (particles) and the zirconia powder (particles) will not particularly be influenced, since the crystalline region and the amorphous region can be distinguished by EDX (energy dispersive X-ray analysis).

Such a substrate can suitably be used for production of a light emitting device. A light emitting device comprises at least the above substrate and a light emitting element such as a LED element mounted on the substrate. Such a light emitting device can suitably be used for a back light of a mobile phone, a large-sized liquid crystal TV, etc.

The FIGURE is a cross-sectional view illustrating one example of a light-emitting device having the above substrate. A light emitting device 1 comprises, for example, a substantially flat plate-form substrate 2, and on a mounting portion 21 provided at substantially the center portion, a light emitting element 4 such as a LED element is mounted via an adhesive 3. The substrate 2 has a pair of connection terminals 22 around the mounting portion 21, and to these connection terminals 22, a pair of electrodes of the light emitting element 4 which are not shown is electrically connected by means of a bonding wire 5.

In the interior of the substrate 2, vias 23 for current application are provided as penetrating in the thickness direction so as to be electrically connected to the pair of connection terminals 22, and a pair of external connection terminals 24 is provided so as to be electrically connected to the vias 23 for current application. Further, just under the mounting portion 21, thermal vias 25 are formed as penetrating. Further, a mold material 6 is provided so as to cover the light emitting element 4 and the connection terminals 22, thereby to constitute the light emitting device 1.

According to such a light emitting device 1, as the substrate 2 has a high reflectance, leakage of light from the light emitting element 4 to the back side can be suppressed, and the light intensity on the surface side can be made high. Further, as the substrate 2 has a high thermal conductivity, the decrease in the brightness due to the temperature increase of the light emitting element 4 can be suppressed. Further, as the surface roughness of the substrate 2 is small, the thermal resistance tends to be low, and a decrease in the brightness due to the temperature increase of the light emitting element 4 can be more suppressed.

EXAMPLES

Examples 1 to 5 and Comparative Examples 1 to 3

First, materials were blended and mixed to achieve a composition of 60.4 mol % of $SiO_2$, 15.6 mol % of $B_2O_3$, 6.0 mol % of $Al_2O_3$, 15.0 mol % of CaO, 2.0 mol % of $Na_2O$ and 1.0 mol % of $K_2O$, the mixture was put in a platinum crucible and melted at from 1,500 to 1,600° C. for 60 minutes, and then the molten glass was cooled to obtain a glass block. The glass softening point (Ts) of the obtained glass was 830° C. This glass softening point (Ts) is a value measured by a differential thermal analysis apparatus (tradename: Thermo Plus TG8110) manufactured by Rigaku Corporation.

The above glass block was ground by a ball mill made of alumina using water as a solvent for from 20 to 60 hours to obtain a borosilicate glass powder. The average particle size of the glass powder was 2.0 µm in each Example. The average particle size of the glass powder was a value evaluated by measuring the glass powder embedded in a resin by means of SEM as mentioned above.

Then, the borosilicate glass powder, an alumina powder and a zirconia powder were blended and mixed so as to achieve a proportion (mass %) shown in the columns for the glass ceramic composition in Table 1 to obtain a mixture. The alumina powder in Examples 1 to 3 was AL47-H (average particle size: 2.1 µm) manufactured by SHOWA DENKO K.K. The alumina powder in Example 4 was AA1.5 (average particle size: 1.5 µm) manufactured by Sumitomo Chemical Co., Ltd., and the alumina powder in Example 5 was AA3.0 (average particle size: 3.0 µm) manufactured by Sumitomo Chemical Co., Ltd. Further, the zirconia powder was 3YS-007 (average particle size: 250 nm) manufactured by TORAY INDUSTRIES INC., which is a partially stabilized zirconia powder. The average particle size of each ceramic powder is a value evaluated by observing the ceramic powder embedded in a resin by means of SEM as mentioned above.

With 50 g of this mixture, 15 g of an organic solvent (a mixture of toluene, xylene, 2-propanol and 2-butanol in a mass ratio of 4:2:2:1), 2.5 g of a plasticizer (di-2-ethylhexyl phthalate), 5 g of a resin (polyvinyl butyral PVK#3000K manufactured by Denki Kagaku Kogyo Kabushiki Kaisha) and 0.5 g of a dispersing agent (DISPERBYK180 manufactured by BYK Japan K.K.) were mixed to prepare a slurry. This slurry was applied on a PET film by a doctor blade method and dried to obtain a green sheet having a thickness of 0.2 mm.

Further, an electrically conductive metal powder (silver powder, manufactured by DAIKEN CHEMICAL CO., LTD., tradename: S550) was mixed so that the solid content became 85 mass %. The vehicle was a mixture of ethyl cellulose and α-terpineol as a solvent in a mass ratio of 15:85. The above mixture of the electrically conductive metal powder and the vehicle was kneaded in a porcelain mortal for one hour, followed by dispersion by three rolls three times to prepare an electrically conductive metal paste.

Then, using the green sheets in Examples 1 to 5 and Comparative Examples 1 to 3 and the electrically conductive metal paste, the following evaluations were carried out.
(Luminous Flux, Thermal Resistance)

Using the green sheet and the electrically conductive metal paste, a substrate for evaluation of the luminous flux was prepared. First, on a laminate of 6 sheets of about 40 mm square green sheets, through holes with a diameter of 0.3 mm were formed at portions to be thermal vias by a punch, and the through holes were filled with the metal paste by a screen printing method to form non-fired thermal vias, and further, non-fired connection terminals and non-fired external connection terminals were formed to obtain a non-fired substrate. This non-fired substrate was held at 550° C. for 5 hours for degreasing, and further filled at 870° C. for 30 minutes for firing thereby to produce a substrate for evaluation.

On the substrate for evaluation, a LED element was mounted to prepare a light emitting element. First, on the substrate for evaluation, one LED element (manufactured by SHOWA DENKO K.K., tradename: GQ2CR460Z) was fixed by means of a die bonding material (manufactured by Shin-Etsu Chemical Co., Ltd., tradename: KER-3000-M2) and its electrode was electronically connected to the connection terminal by means of a bonding wire, followed by sealing by a sealing agent (manufactured by Shin-Etsu Chemical Co., Ltd., tradename: CSR-1016A). The sealing agent was one containing a phosphor (manufactured by KASEI OPTONIX CO., LTD., tradename: P46-Y3) in an amount of 20 mass % to the sealing agent.

Then, 35 mA of electric current was applied to the LED element by means of a voltage/current generator (manufactured by ADVANTEST CORPORATION, tradename: R6243), to measure the total luminous flux of light obtained from the light emitting device and the thermal resistance. The total luminous flux was measured by providing the light-emitting device in an integrating sphere (diameter: 6 inches), by means of a total luminous flux-measuring device (manufactured by Spectra Co-op, tradename: SOLIDLAMBDA•CCD•LED•MONITOR•PLUS). Further, the thermal resistance was measured by means of a thermal resistance measuring device (manufactured by Mine Koon Denki K.K., tradename: TH-2167. The applied electric current was 35 mA, and the electric current was applied until the voltage drop was saturated, whereupon the saturation temperature was calculated by the temperature coefficient lead from the dropped voltage and the temperature-voltage drop properties of the LED element, and the thermal resistance was obtained. The obtained total luminous flux and the thermal resistance are show in Table 1. The total luminous flux is shown by a percentage when the total luminous flux in Comparative Example 1 was regarded as 100, and the thermal resistance is shown by a percentage when the thermal resistance in Comparative Example 3 was regarded as 100.
(Reflectance)

The reflectance was measured by the following method. That is, one about 30 mm square green sheet, a laminate of two such sheets and a laminate of three such sheets were held at 550° C. for 5 hours to decompose and remove resin components, and then held at 870° C. for 30 minutes for firing, to prepare three substrates for evaluation having thicknesses at a level of 140 μm, 280 μm and 420 μm, respectively. The reflectance of each of such substrates for evaluation was measured by using a spectroscope USB2000 and a small integrating sphere ISP-RF each manufactured by Ocean Optics Inc. to calculate the reflectance (unit: %) of a substrate for evaluation having a thickness of 300 μm by linear complementation regarding the thickness. The reflectance was at a wavelength of 460 nm, and barium sulfate was used as a reference.

(Thermal Conductivity)

A laminate of 6 sheets of about 40 mm square green sheets was held at 550° C. for 5 hours to decompose and remove resin components and then held at 870° C. for 30 minutes for firing to prepare a substrate for evaluation having a thickness at a level of 0.85 mm. With respect to this substrate for evaluation, the thermal conductivity at room temperature was measured by a laser flash method. As the measuring apparatus, TC-7000 manufactured by ULVAC-RIKO, Inc. was used.

(Surface Roughness)

A laminate of 6 sheets of about 40 mm square green sheets was held at 550° C. for 5 hours to decompose and remove resin components and then held at 870° C. for 30 minutes for firing to obtain a substrate for evaluation having a thickness at a level of 0.85 mm. With respect to this substrate for evaluation, the surface roughness Ra was measured by using a contact surface roughness meter (manufactured by TOKYO SEIMITSU CO., LTD., tradename: SURFCOM 1400D) in accordance with a method disclosed in JIS-B0601 (1994).

(Divisibility)

On a laminate of 6 sheets of about 40 mm square green sheets, notches were put with intervals of 5 mm so as to be equally divided into 8 sections respectively in longitudinal and lateral directions (64 sections in total) by means of G-Cut 6 manufactured by UHT Corporation. The depth of each notch was 0.25 mm. The thickness of the laminate of the green sheets was at a level of 1.0 mm. The obtained laminate of green sheets was held at 550° C. for 5 hours to decompose and remove resin components and then held at 870° C. for 30 minutes to obtain collected substrates for evaluation. The collected substrates for evaluation were divided along the above-described notches by G-Cut 6 by using a polycarbonate with a groove having a depth of 5 mm, and the proportion of fracture, chipping and the like was evaluated. The smaller the proportion of fracture and chipping, the better the divisibility and the more excellent the mass productivity. The proportion of fracture and chipping is preferably at most 5%.

As evident from Table 1, of the glass ceramic compositions in Examples 1 to 3 comprising the glass powder, the alumina powder and the zirconia powder within predetermined ranges, the reflectance is at least 90%, the thermal conductivity is at least 2.5 W/m·K, and the surface roughness is at most 0.35 μm, whereby a substrate having a low thermal resistance and a high luminous flux can be obtained. Further, it is found that with the glass ceramic compositions in Examples 1 to 5, favorable divisibility is obtained, whereby fracture and chipping at the time of division can be suppressed. On the other hand, with respect to the glass ceramic compositions in Comparative Examples 1 to 3 having an excessively low or excessively high content of the zirconia powder, although one of the reflectance and the thermal conductivity can be made high, both of them cannot be simultaneously high. Blanks in Table 1 are properties of the glass ceramic compositions not measured.

TABLE 1

|  |  |  | Ex. |  |  |  |  | Comp. Ex. |  |  |
|---|---|---|---|---|---|---|---|---|---|---|
|  |  |  | 1 | 2 | 3 | 4 | 5 | 1 | 2 | 3 |
| Glass ceramic composition (mass %) | Glass powder |  | 36 | 35 | 35 | 35 | 35 | 40 | 38 | 35 |
|  | Alumina powder | 1.5 μm |  |  |  | 40 |  |  |  |  |
|  |  | 2.1 μm | 47 | 40 | 37 |  |  | 60 | 54 | 33 |
|  |  | 3.0 μm |  |  |  |  | 40 |  |  |  |
|  | Zirconia powder |  | 17 | 25 | 28 | 25 | 25 | 0 | 9 | 32 |
| Reflectance (%) |  |  | 90 | 91 | 92 | 92 | 92 | 81 | 85 | 94 |
| Thermal conductivity (W/m · K) |  |  | 3.7 | 3.0 | 2.8 |  |  | 4.2 | 4.0 | 2.1 |
| Surface roughness (μm) |  |  | 0.3 | 0.33 | 0.35 | 0.33 | 0.33 | 0.26 | 0.28 | 0.38 |
| Thermal resistance (%) |  |  | 85 | 85 | 90 |  |  | 82 | 83 | 100 |
| Luminous flux (%) |  |  | 116 | 116 | 117 |  |  | 100 | 105 | 122 |
| Divisibility |  |  | 2/400 | 3/400 | 3/400 | 3/400 | 3/400 | 82/400 | 20/400 | 2/400 |

| REFERENCE SYMBOLS | |
|---|---|
| 1: | Light emitting device |
| 2: | Substrate for light emitting element |
| 4: | Light emitting element |

What is claimed is:

1. A glass ceramic composition comprising a glass powder, an alumina powder and a zirconia powder having an average particle size of at most ¼ of the average particle size of the alumina powder, in a proportion of the glass powder of from 30 to 45 mass %, a proportion of the alumina powder of from 35 to 50 mass % and a proportion of the zirconia powder of from 10 to 30 mass %, to the total amount of the glass powder, the alumina powder and the zirconia powder.

2. The glass ceramic composition according to claim 1, wherein the average particle size of the alumina powder is from 1.0 to 4.0 μm, and the average particle size of the zirconia powder is from 0.03 to 0.5 μm.

3. The glass ceramic composition according to claim 1, wherein the amount of the zirconia powder is from 15 to 30 mass % to the total amount of the glass powder, the alumina powder and the zirconia powder.

4. The glass ceramic composition according to claim 1, wherein the zirconia powder comprises stabilized zirconia or partially stabilized zirconia.

5. The glass ceramic composition according to claim 1, wherein a glass softening point (Ts) of glass of the glass powder is from 650 to 950° C.

6. The glass ceramic composition according to claim 1, which further contains an organic component which can be lost by firing.

7. The glass ceramic composition according to claim 6, wherein the content of the organic component is from 3 to 35 mass % to the glass ceramic composition.

8. The glass ceramic composition according to claim 1, to be used for production of a substrate on which a light emitting element is to be mounted.

9. A method for producing a substrate for a light emitting element, which comprises firing a formed product of the glass ceramic composition as defined in claim 1, at a temperature at which glass of the glass powder is softened.

10. The method for producing a substrate for a light emitting element according to claim 9, wherein the firing temperature is from 850 to 900° C.

11. A substrate for a light emitting element on which a light emitting element is to be mounted, which is formed by firing a formed product of the glass ceramic composition as defined in claim 1.

12. A light emitting device comprising a substrate for a light emitting element and a light emitting element mounted on the substrate for a light emitting element, wherein the substrate for a light emitting element is the substrate for a light emitting element as defined in claim 11.

* * * * *